United States Patent
Chiba et al.

(10) Patent No.: US 11,730,675 B2
(45) Date of Patent: Aug. 22, 2023

(54) MEDICINE REMOVAL DETECTION SYSTEM

(71) Applicant: Murata Manufacturing Co., Ltd., Nagaokakyo (JP)

(72) Inventors: Risa Chiba, Nagaokakyo (JP); Takanori Nakamura, Nagaokakyo (JP); Kosuke Hamada, Nagaokakyo (JP); Takaaki Asada, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 17/653,179

(22) Filed: Mar. 2, 2022

(65) Prior Publication Data
US 2022/0183929 A1 Jun. 16, 2022

Related U.S. Application Data

(63) Continuation of application No. PCT/JP2020/034857, filed on Sep. 15, 2020.

(30) Foreign Application Priority Data

Oct. 1, 2019 (JP) ................. 2019-181551

(51) Int. Cl.
*A61J 1/03* (2023.01)
*H02J 7/00* (2006.01)
(Continued)

(52) U.S. Cl.
CPC ............. *A61J 1/03* (2013.01); *H01M 10/488* (2013.01); *H02J 7/0048* (2020.01); *H02N 2/001* (2013.01);
(Continued)

(58) Field of Classification Search
CPC ...... A61J 1/03; A61J 2200/30; A61J 2200/70; H02J 7/0048; H01M 10/488; H01M 2220/30; H02N 2/001
See application file for complete search history.

(56) References Cited

U.S. PATENT DOCUMENTS 5,871,831 A * 2/1999 Zeiter .................. A61J 7/0481
206/524.1
6,973,371 B1 * 12/2005 Benouali ................ A61J 1/035
700/242
(Continued)

FOREIGN PATENT DOCUMENTS

JP 2013031638 A 2/2013
JP 2018183351 A 11/2018
(Continued)

OTHER PUBLICATIONS

International Search Report issued for PCT/JP2020/034857, dated Nov. 17, 2020.

*Primary Examiner* — Michael Collins
(74) *Attorney, Agent, or Firm* — ArentFox Schiff LLP

(57) ABSTRACT

A medicine removal detection system is provided that includes a medication device and a storage member in a sheet shape storing the medication device. The medication device includes medicine, a secondary battery, and a signal transmission unit that transmits a signal indicating a state of the secondary battery. The storage member includes the electric current supply line for supplying an electric current to the secondary battery of the medication device, and is configured such that a supply environment of an electric current to the secondary battery changes when the medication device is taken out. The signal transmission unit transmits a signal indicating a state change of the secondary battery based on a change in the supply environment of an electric current to the secondary battery of the storage member.

20 Claims, 2 Drawing Sheets

(51) Int. Cl.
  *H02N 2/00* (2006.01)
  *H01M 10/48* (2006.01)
(52) U.S. Cl.
  CPC ........ *A61J 2200/30* (2013.01); *A61J 2200/70* (2013.01); *H01M 2220/30* (2013.01)

(56) References Cited

U.S. PATENT DOCUMENTS

| | | | | |
|---|---|---|---|---|
| 7,178,417 | B2* | 2/2007 | Petersen | A61J 7/0481 |
| | | | | 73/865.8 |
| 8,960,440 | B1* | 2/2015 | Kronberg | A61J 1/035 |
| | | | | 340/568.1 |
| 10,108,892 | B2* | 10/2018 | Sengstaken, Jr. | A61J 7/04 |
| 11,186,420 | B2* | 11/2021 | Kosaka | B65D 83/04 |
| 2005/0223826 | A1* | 10/2005 | Petersen | A61J 7/0481 |
| | | | | 206/534 |
| 2016/0137380 | A1 | 5/2016 | Kosaka | |
| 2020/0093700 | A1 | 3/2020 | Yokoi et al. | |
| 2020/0293849 | A1 | 9/2020 | Wakita et al. | |
| 2022/0202650 | A1* | 6/2022 | Hamada | G01S 15/04 |

FOREIGN PATENT DOCUMENTS

| | | | |
|---|---|---|---|
| WO | 2015008528 | A1 | 1/2015 |
| WO | 2018207681 | A1 | 11/2018 |
| WO | 2019069772 | A1 | 4/2019 |

\* cited by examiner

MEDICINE REMOVAL DETECTION SYSTEM

CROSS REFERENCE TO RELATED APPLICATIONS

The present application is a continuation of PCT/JP2020/034857 filed Sep. 15, 2020, which claims priority to Japanese Patent Application No. 2019-181551, filed Oct. 1, 2019, the entire contents of each of which are incorporated herein by reference.

TECHNICAL FIELD

The present invention relates to a medicine removal detection system that detects that a medicine has been taken out.

BACKGROUND

There is a need for a system that can check whether a patient has taken a prescribed medicine, as well as a system that can detect that the medicine has been taken out from a predetermined location.

Japanese Patent Application Laid-Open No. 2018-183351 (hereinafter "Patent Document 1") describes a medicine taking support system that includes a medicine box including a plurality of small rooms for storing medicine and an opening/closing door provided to close openings of all the small rooms from above and that is capable of being locked/unlocked. The system also includes a management server, in which when it is detected that any of the medicines is taken out from the small room of the medicine box, a notification indicating the detection is transmitted from the medicine box to the management server.

However, the medicine taking support system described in Patent Document 1 has a problem that it is necessary to set the medicines to be taken one by one in small rooms of the dedicated medicine box, which takes time and effort.

SUMMARY OF THE INVENTION

Accordingly it is an object of the present invention to provide a medicine removal detection system constructed for detecting that a medicine has been taken out without taking time and effort to set medicines to be taken one by one in a dedicated medicine box.

In an exemplary embodiment, a medicine removal detection system is provided that includes a medication device; and a storage member in a sheet shape that stores the medication device. The medication device includes a medicine, a secondary battery, and a signal transmission unit configured to transmit a signal indicating a state of the secondary battery. The storage member includes an electric current supply line for supplying an electric current to the secondary battery of the medication device, and is configured such that a supply environment of an electric current to the secondary battery changes when the medication device is taken out. Moreover, the signal transmission unit transmits a signal indicating a state change of the secondary battery based on a change in the supply environment of an electric current to the secondary battery of the storage member.

According to the medicine removal detection system of the exemplary embodiment of the present invention, an electric current is supplied to the secondary battery of the medication device through the electric current supply line of the storage member, and when the medication device is taken out from the storage member and, thereby, the supply environment of the electric current to the secondary battery changes and accordingly the state of the secondary battery changes, a signal indicating a state change of the secondary battery is transmitted. Based on the state change of the secondary battery, it can be detected when the medication device has been taken out from the storage member. In the exemplary medicine removal detection system, since the medication device is configured to be stored in the storage member in a sheet shape like a generally used PTP sheet, it is possible to detect that the medication device containing a medicine has been taken out from the storage member without taking time and effort to set the medicine to be taken one by one in small rooms of a dedicated medicine box.

DETAILED DESCRIPTION

An exemplary embodiment of the present invention will be described below to specifically describe features of the present invention.

Figure 1:
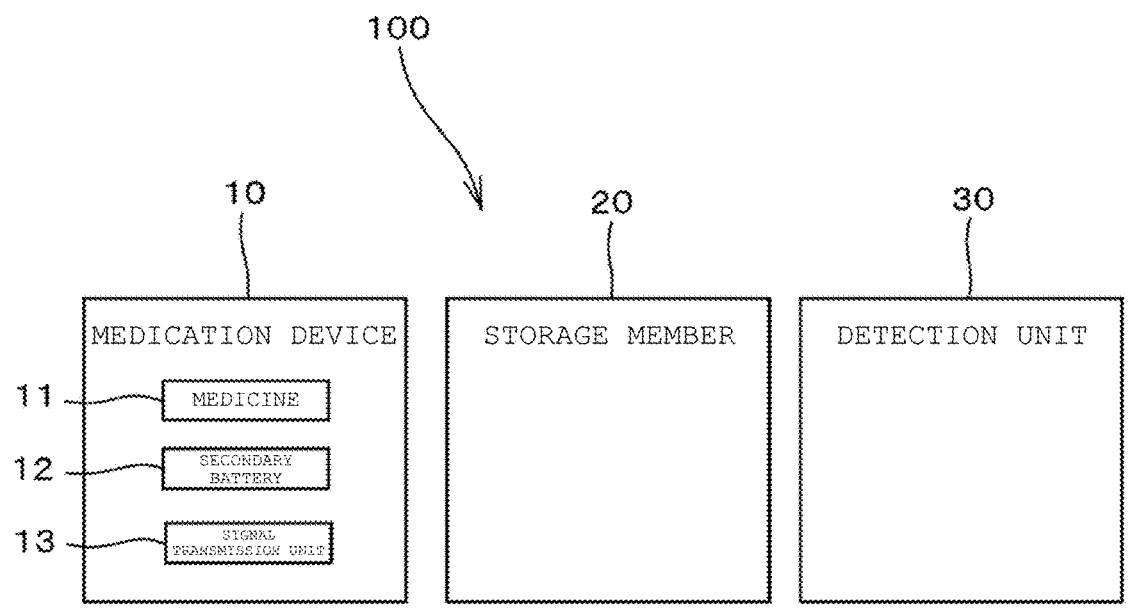
FIG. 1 is a block diagram schematically illustrating a configuration of a medicine removal detection system according to an exemplary embodiment.

FIG. 1 is a block diagram schematically illustrating a configuration of a medicine removal detection system 100 according to an exemplary embodiment. As shown, the medicine removal detection system 100 includes a medication device 10 and a storage member 20. The medicine removal detection system 100 according to the present embodiment further includes a detection unit 30.

The storage member 20 is a member in a sheet shape that stores the medication device 10. In the present embodiment, the storage member 20 is a press through pack sheet (PTP sheet). The storage member 20 is constructed to store a plurality of medication devices 10.

Figure 2:
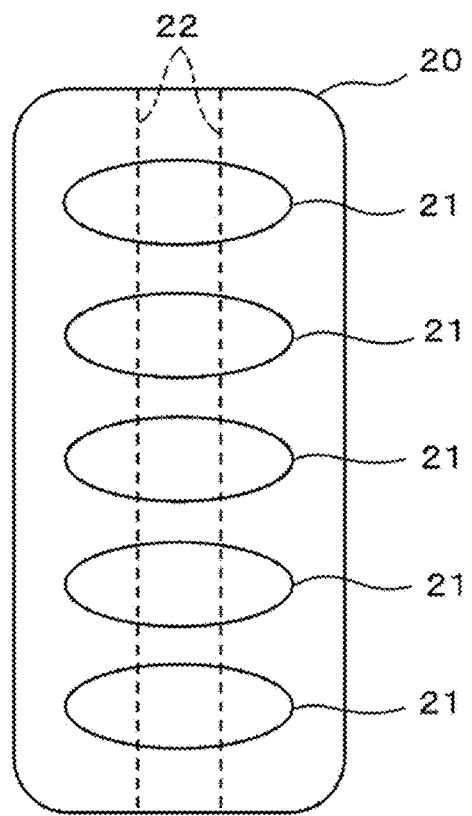
FIG. 2 is a plan view illustrating a configuration of a storage member.

FIG. 2 is a plan view illustrating a configuration of the storage member 20. The storage member 20 is provided with a plurality of pockets 21 for storing the medication devices 10. In the exemplary aspect, one medication device 10 is stored in each pocket 21. However, it is also possible to store a plurality of medication devices 10 for one dose in one pocket 21 according to another exemplary aspect. In addition, it is also possible to store a plurality of medicines in one pocket 21, and to set one of the plurality of medicines to be stored as the medication device 10 of the present embodiment. In that case, when it is detected that the medication device 10 of the present embodiment has been taken out, it can be inferred that other medicines have also been taken out.

For purposes of this disclosure, the term "in a sheet shape" of the storage member 20 means that a portion other than a portion for storing the medication device 10, in other words, the portion other than the pocket 21 in the example illustrated in FIG. 2, has a sheet shape.

Moreover, the storage member 20 includes an electric current supply line 22 for supplying an electric current to a secondary battery 12 of the medication device 10 to be described later. When the storage member 20 is set at a predetermined position where an electric current can be supplied, for example, in a storage box provided with a power supply, an electric current is supplied to the secondary battery 12 of the medication device 10 to be described later through the electric current supply line 22. That is, when the medicine removal detection system 100 is used, the electric current is supplied to the secondary battery 12 of the medication device 10 through the electric current supply line 22.

The storage member 20 is configured such that a supply environment of an electric current to the secondary battery 12 of the medication device 10 changes when the stored medication device 10 is taken out. Specifically, when the medication device 10 is taken out (e.g., removed by a patient or user), the electric current supply line 22 is disconnected, for example, and the electric current supply to the secondary battery 12 is interrupted.

In an exemplary aspect, the medication device 10 containing the medicine 11 is sold in a state of being stored in the storage member 20, similarly to a general PTP sheet. That is, it is not necessary for a user to store the medication device 10 containing the medicine 11 to be taken in the storage member 20. In addition, similarly to a general PTP sheet, when the medicine is taken, the user only has to take out the medication device 10 from the storage member 20 and take the medicine.

It is noted that in FIG. 2, the number of pockets 21 provided in the storage member 20 is five. However, the number of pockets 21 is not limited to five, and may be only one, for example, or any other number. In addition, the storage member 20 may include a battery, and may be configured to supply an electric current to the electric current supply line 22 without requiring an external power supply.

The medication device 10 includes a medicine 11, a secondary battery 12, and a signal transmission unit 13. It is noted that the shape of the medication device 10 is not particularly limited, and has, for example, a capsule-like shape that can be stored in the pocket 21 of the storage member 20. In that case, the medicine 11, the secondary battery 12, and the signal transmission unit 13 can be covered with a resin. The medicine 11 may be contained in a manner in which the medicine is attached to the surface of the medication device 10 or may be contained inside the medication device 10.

As the secondary battery 12, for example, an all-solid-state battery having a solid electrolyte is preferably used. In that case, as the solid electrolyte, for example, a solid electrolyte containing a NASICON-type crystal oxide can be used. Since an all-solid-state battery not containing an electrolytic solution is used as the secondary battery 12, the electrolytic solution does not flow into the body, resulting in high safety. However, as long as safety can be secured, a battery having an electrolytic solution can be used as the secondary battery 12.

Figure 3:
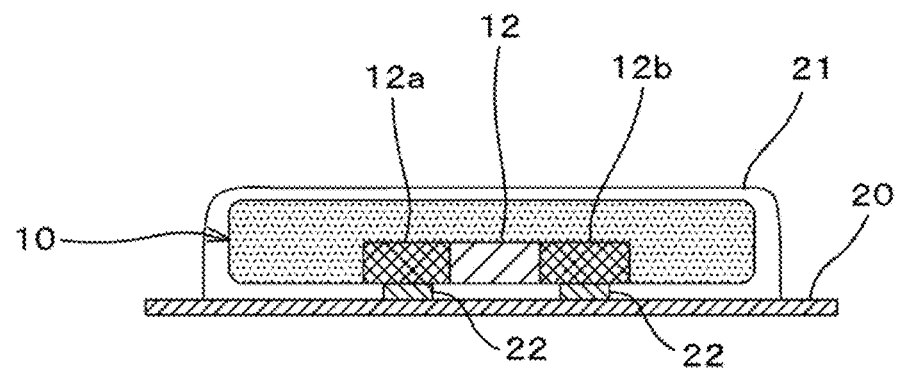
FIG. 3 is an example of a sectional view illustrating a state in which a medication device is stored in a pocket of a storage member.

FIG. 3 is an example of a sectional view taken along a plane orthogonal to an extending direction of the electric current supply line 22 in a state where the medication device 10 is stored in the pocket 21 of the storage member 20. When the medication device 10 is stored in the pocket 21 of the storage member 20, a positive electrode 12a of the secondary battery 12 is electrically connected to one of two electric current supply lines 22 of the storage member 20, and a negative electrode 12b is electrically connected to the other of the two electric current supply lines 22. In the exemplary aspect of FIG. 3, the positive electrode 12a and the negative electrode 12b of the secondary battery 12 are exposed on the surface of the medication device 10 and are configured to be electrically connected to respective electric current supply lines 22 when the medication device 10 is stored in the pocket 21 of the storage member 20.

However, the positive electrode 12a and the negative electrode 12b of the secondary battery 12 may not be exposed on the surface of the medication device 10. Alternatively, a positive electrode terminal connected to the positive electrode 12a and a negative electrode terminal connected to the negative electrode 12b may be exposed on the surface of the medication device 10 and be configured to be electrically connected to respective electric current supply lines 22.

It is noted that the sectional view illustrated in FIG. 3 is merely an example, and the configuration of the medication device 10 is not limited to the configuration illustrated in FIG. 3. For example, a configuration in which a device containing the secondary battery 12 and the like is bonded to the medicine 11 may be used.

In a state where the medication device 10 is stored in the pocket 21 of the storage member 20, a space exists around the medication device 10 as illustrated in FIG. 3 and the medication device 10 is movable. Also in a state where the medication device 10 is moved in the pocket 21, the positive electrode 12a of the secondary battery 12 is configured to be electrically connected to one of two electric current supply lines 22 of the storage member 20, and the negative electrode 12b is configured to be electrically connected to the other of the two electric current supply lines 22.

When an electric current is supplied to the electric current supply line 22 when the positive electrode 12a of the secondary battery 12 is electrically connected to one of the two electric current supply lines 22 and the negative electrode 12b of the secondary battery 12 is electrically connected to the other, the electric current is supplied to the secondary battery 12 to charge the secondary battery 12.

The voltage of the secondary battery 12 is constant while the electric current is supplied through the electric current supply line 22 in the fully charged state. In this state, when the medication device 10 is taken out from the pocket 21 of the storage member 20, the supply of the electric current to the secondary battery 12 is stopped, and the state of the secondary battery 12 changes. Examples of the state change of the secondary battery 12 include a decrease in the voltage of the secondary battery 12.

The signal transmission unit 13 is configured to transmit a signal indicating a state change of the secondary battery 12 based on a change in the supply environment of an electric current to the secondary battery 12 of the storage member 20. That is, the signal transmission unit 13 detects the state change of the secondary battery 12 and transmits a signal indicating the state change of the secondary battery 12, for example, a signal indicating that the voltage of the secondary battery 12 has decreased.

In an exemplary aspect of the signal transmission unit 13, for example, a piezoelectric element can be used. In that case, the piezoelectric element vibrates based on the state change of the secondary battery 12, thereby outputting a vibration signal as a signal indicating the state change of the secondary battery 12. The vibration signal is, for example, an ultrasonic signal. That is, the piezoelectric element functions as the signal transmission unit 13 that detects a state change of the secondary battery 12 and transmits a signal indicating the state change of the secondary battery 12.

Moreover, the signal transmission unit 13 may be configured to transmit a signal indicating that the voltage of the secondary battery 12 has decreased together with the information on the medicine 11. For example, an IC may further be provided in addition to the above-described piezoelectric element, and the IC may be configured to control the frequency and amplitude of vibration of the piezoelectric element according to an ID, a lot number, or the like of the medicine 11. In that case, the IC is configured to control the frequency and amplitude of the vibration of the piezoelectric element according to the ID, the lot number, or the like of the medicine 11 contained in the medication device 10. Since the signal transmission unit 13 also transmits the information on the medicine 11, when the detection unit 30 to be described later detects that the medication device 10 has been taken out from the storage member 20, it is possible to identify the medicine 11 contained in the medication device 10 that has been taken out.

It is noted that, a voltage sensor may be provided to detect a state change of the secondary battery 12. In that case, the voltage sensor continuously monitors the voltage of the secondary battery 12 to detect a state change of the secondary battery 12, more specifically, a decrease in the voltage.

In addition, the signal transmission unit 13 may be configured to transmit a signal indicating that the voltage of the secondary battery 12 has decreased by wireless communication.

In operation, the detection unit 30 is configured to detect that the medication device 10 has been taken out from the storage member 20 on the basis of the signal transmitted from the signal transmission unit 13. In a case where the signal transmission unit 13 is a piezoelectric element, for example, the detection unit 30 is attached to a body and receives a vibration signal output from the piezoelectric element. By receiving the vibration signal, the detection unit 30 can determine that the medication device 10 has been taken out from the storage member 20. As described above, by using the piezoelectric element as the signal transmission unit 13, it is possible to reliably detect that the medication device 10 has been taken out from the storage member 20 with a simple configuration.

Furthermore, the detection unit 30 may be configured to analyze the frequency and amplitude of the vibration signal when receiving the vibration signal transmitted from the piezoelectric element which is the signal transmission unit 13 to acquire information on the medicine 11. The information on the medicine 11 is, for example, an ID, a lot number, or the like of the medicine 11.

Furthermore, as described above, in a case where the signal transmission unit 13 transmits a signal by wireless communication, the detection unit 30 may be configured to receive a wireless signal.

It is noted that, when the detection unit 30 detects that the medication device 10 has been taken out from the storage member 20 on the basis of the signal transmitted from the signal transmission unit 13, the detection unit 30 may in turn transmit, to a management server (not illustrated), the fact that the medication device 10 has been taken out. The transmission of a signal to the management server can be performed, for example, by wireless communication.

In general, it is noted that the present invention is not limited to the above embodiment, and various applications and modifications can be made within the scope of the present invention. For example, although the medicine removal detection system 100 according to the embodiment described above includes the detection unit 30 that detects that the medication device 10 has been taken out from the storage member 20 separately from the medication device 10, the medication device 10 may include the detection unit. In that case, the detection unit detects that the medication device 10 has been taken out from the storage member 20 based on the state change of the secondary battery 12.

DESCRIPTION OF REFERENCE SYMBOLS

10: Medication device
11: Medicine
12: Secondary battery
13: Signal transmission unit
20: Storage member
21: Pocket
22: Electric current supply line
30: Detection unit
100: Medicine removal detection system

The invention claimed is:

1. A medicine removal detection system, comprising:
    a medication device that includes:
        a medicine,
        a secondary battery, and
        a signal transmission unit configured to transmit a signal indicating a state of the secondary battery; and
    a storage member having a sheet shape constructed to store the medication device, with the storage member including a current supply line constructed to supply an electric current to the secondary battery of the medication device, such that a supply environment of the electric current to the secondary battery changes when the medication device is removed from the storage member,
    wherein the signal transmission unit is configured to transmit the signal indicating a state change of the secondary battery based on a change in the supply environment of the electric current to the secondary battery of the storage member.

2. The medicine removal detection system according to claim 1, further comprising a detection unit configured to detect that the medication device has been removed from the storage member based on the signal transmitted from the signal transmission unit.

3. The medicine removal detection system according to claim 1, wherein the signal transmission unit is a piezoelectric element.

4. The medicine removal detection system according to claim 3, wherein the piezoelectric element is configured to vibrate based on the state change of the secondary battery, thereby outputting a vibration signal as the signal indicating the state change of the secondary battery.

5. The medicine removal detection system according to claim 1, wherein the signal transmission unit is configured to transmit the signal indicating the state change of the secondary battery together with information on the medicine.

6. The medicine removal detection system according to claim 1, wherein the secondary battery is an all-solid battery having a solid electrolyte.

7. The medicine removal detection system according to claim 1, wherein the sheet shape of the storage member is a press through pack sheet.

8. The medicine removal detection system according to claim 1, wherein the current supply line is disconnected when the medication device is removed from the storage member to interrupt the supply environment of the electric current to the secondary battery.

9. The medicine removal detection system according to claim 1, wherein the storage member comprises at least one pocket and the medication device comprises a capsule-like shape constructed to be stored in the at least one pocket.

10. The medicine removal detection system according to claim 1, wherein the current supply line comprises two electric current supply lines.

11. The medicine removal detection system according to claim 10, wherein the secondary battery comprises positive and negative electrodes connected to the two electric current supply lines, respectively.

12. The medicine removal detection system according to claim 11, wherein the positive and negative electrodes of the secondary battery are exposed on a surface of the medication device.

13. The medicine removal detection system according to claim 11, wherein the state change of the secondary battery comprises a decrease in a voltage of the secondary battery.

14. The medicine removal detection system according to claim 13, further comprising a voltage sensor configured to detect the decrease in the voltage of the secondary battery.

15. A medicine removal detection system, comprising:
a medication device that includes a secondary battery, and a signal transmission unit configured to transmit a signal indicating a state of the secondary battery; and
a sheet shaped storage member constructed to store the medication device and that includes a current supply line configured to supply an electric current to the secondary battery that changes when the medication device is removed from the storage member,
wherein the signal transmission unit is configured to transmit the signal indicating a change in the state of the secondary battery based on a change in the electric current supplied to the secondary battery.

16. The medicine removal detection system according to claim 15, further comprising a detection unit configured to detect that the medication device has been removed from the storage member based on the signal transmitted from the signal transmission unit.

17. The medicine removal detection system according to claim 15, wherein the signal transmission unit is a piezoelectric element.

18. The medicine removal detection system according to claim 17, wherein the piezoelectric element is configured to vibrate based on the change in state of the secondary battery, thereby outputting a vibration signal as the signal indicating the change in state of the secondary battery.

19. The medicine removal detection system according to claim 15, wherein the signal transmission unit is configured to transmit the signal indicating the change in state of the secondary battery together with information on a medicine contained therein.

20. The medicine removal detection system according to claim 15, wherein the secondary battery is an all-solid battery having a solid electrolyte.

* * * * *